United States Patent
Otsuka et al.

(10) Patent No.: US 11,487,992 B2
(45) Date of Patent: Nov. 1, 2022

(54) NEURAL NETWORK CIRCUIT

(71) Applicant: DENSO CORPORATION, Kariya (JP)

(72) Inventors: Shigeki Otsuka, Kariya (JP); Irina Kataeva, Kariya (JP)

(73) Assignee: DENSO CORPORATION, Kariya (JP)

( * ) Notice: Subject to any disclaimer, the term of this patent is extended or adjusted under 35 U.S.C. 154(b) by 673 days.

(21) Appl. No.: 16/561,207

(22) Filed: Sep. 5, 2019

(65) Prior Publication Data

US 2019/0392289 A1 Dec. 26, 2019

Related U.S. Application Data

(63) Continuation of application No. PCT/JP2018/002285, filed on Jan. 25, 2018.

(30) Foreign Application Priority Data

Mar. 22, 2017 (JP) .............................. JP2017-055744

(51) Int. Cl.
| | | |
|---|---|---|
| *G06F 7/544* | (2006.01) | |
| *G06N 3/04* | (2006.01) | |
| *G11C 13/00* | (2006.01) | |
| *H03F 3/45* | (2006.01) | |

(52) U.S. Cl.
CPC .............. *G06N 3/04* (2013.01); *G06F 7/5443* (2013.01); *G11C 13/0038* (2013.01); *H03F 3/45* (2013.01); *G11C 13/004* (2013.01)

(58) Field of Classification Search
CPC ........... G06N 3/04; G06F 7/5443; H03F 3/45; G11C 13/0038; G11C 13/004
USPC ........................................................ 706/36
See application file for complete search history.

(56) References Cited

U.S. PATENT DOCUMENTS

| | | | |
|---|---|---|---|
| 8,832,004 B2 | 9/2014 | Kato et al. | |
| 9,135,553 B2 | 9/2015 | Kato et al. | |
| 9,608,614 B2 | 3/2017 | Sugiyama et al. | |
| 9,906,212 B2 | 2/2018 | Sugiyama et al. | |
| 2019/0378003 A1* | 12/2019 | Otsuka ................... | G06N 3/063 |

OTHER PUBLICATIONS

Liu et al., "A Heterogeneous Computing System with Memristor-Based Neuromorphic Accelerators," 2014 IEEE High Performance Extreme Computing Conference (HPEC), Sep. 9-11, 2014, Waltham, MA, USA.

* cited by examiner

*Primary Examiner* — Ly D Pham
(74) *Attorney, Agent, or Firm* — Posz Law Group, PLC

(57) ABSTRACT

A neural network circuit that uses a ramp function as an activation function includes a memory device in which memristors serving as memory elements are connected in a matrix. The neural network circuit further includes I-V conversion amplification circuits for converting currents flowing via the memory elements into voltages, a differential amplifier circuit for performing a differential operation on outputs of two I-V conversion amplification circuits, an A-D converter for performing an A-D conversion on a result of the differential operation, and an output determine that, by referring to input signals of the differential amplifier circuit, determines whether an output signal value of the differential amplifier circuit belongs to an active region or an inactive region. Based on a determination result, the input determiner switches over the differential amplifier circuit and the A-D converter between an operating state and a standby state.

5 Claims, 3 Drawing Sheets

NEURAL NETWORK CIRCUIT

CROSS-REFERENCE TO RELATED APPLICATIONS

The present application is a continuation application of International Patent Application No. PCT/JP2018/002285 filed on Jan. 25, 2018, which designated the U.S. and claims the benefit of priority from Japanese Patent Application No. 2017-55744 filed on Mar. 22, 2017. The entire disclosures of all of the above applications are incorporated herein by reference.

TECHNICAL FIELD

The present disclosure relates to a neural network circuit including a memory device in which memristors serving as memory elements are connected in a matrix

BACKGROUND

Currently, studies are ongoing to construct a neural network circuit that uses memristors.

SUMMARY

The present disclosure provides a neural network circuit that can reduce power consumption.

In an aspect of the present disclosure, a neural network circuit uses a ramp function as an activation function and comprises: a memory device including memristors serving as memory elements connected in a matrix; a plurality of current-to-voltage (I-V) conversion amplification circuits that convert currents flowing via the memory elements into voltages and output the voltages; a differential amplifier circuit that performs a differential operation on outputs of two I-V conversion amplification circuits forming a pair included in the plurality of I-V conversion amplification circuits; an analog-to-digital (A-D) converter that performs an A-D conversion on a result of the differential operation of the differential amplifier circuit; and an output determiner that, by referring to input signals of the differential amplifier circuit, performs a determination of whether a value of an output signal of the differential amplifier circuit belongs to an active region or an inactive region. Based on a result of the determination, the input determiner switches over the differential amplifier circuit and the A-D converter between an operating state and a standby state.

BRIEF DESCRIPTION OF THE DRAWINGS

Objects, features and advantages of the present disclosure will become more apparent from the following detailed description made with reference to the accompanying drawings. In the drawings.

DETAILED DESCRIPTION

Figure 5:
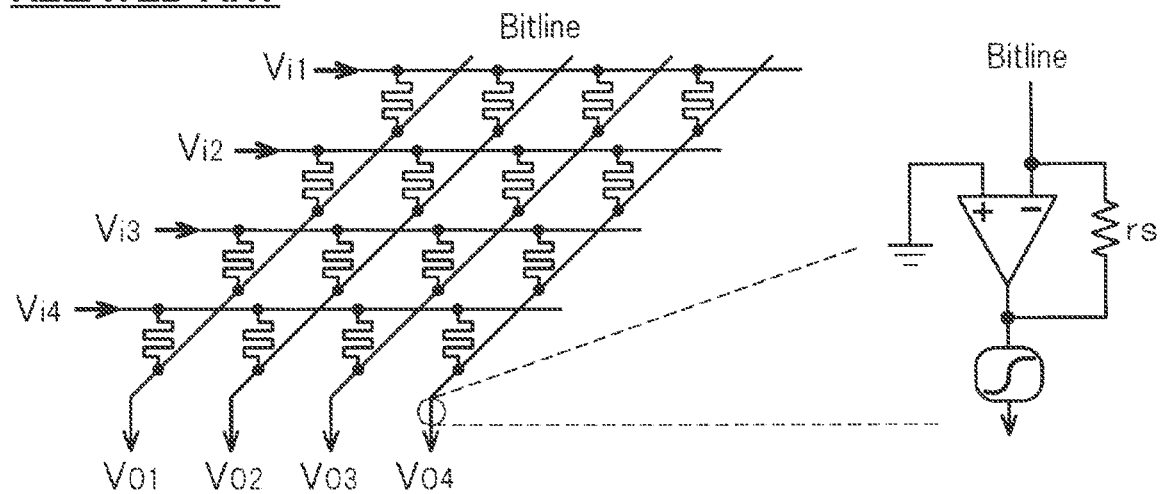
FIG. 5 is a diagram illustrating memristors connected in a matrix.

Some neural network circuits use memristors as synapses. The memristor is a non-volatile two-terminal element of which the conductance value is variable. In such a neural network circuit, the memristors are arranged in a matrix and voltages are applied to the memristors to generate currents, as shown in FIG. 5. The composite current is converted into a voltage by a transimpedance amplifier and is output as a voltage value after its waveform is shaped by an activation function. In the neural network circuit, the memristors act as synapses and the transimpedance amplifiers act as neurons. The transimpedance amplifier performs, by an analog operation, multiply-accumulate operation on the conductance values of the memristors and the applied voltages.

A typical arrangement for performing a multiply-accumulate operation by a digital operation includes a digital circuit that multiplies weight data stored in a memory by input data and that accumulates the multiplication results.

Figure 6:
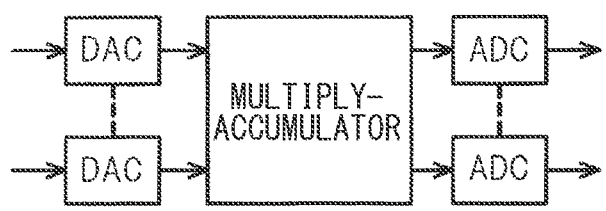
FIG. 6 is a diagram illustrating an arrangement of a D-A converter, a multiply-accumulator, and an A-D converter.

In an arrangement for performing a multiply-accumulate operation by an analog operation, input data are converted into voltages by digital-to-analog (D-A) converters as shown in FIG. 6. In an analog circuit, the input voltages are multiplied by conductance values of memristors serving as weights, as shown in FIG. 5. Current values are added together in a memristor crossbar arrangement and converted into a voltage by a current-to-voltage (I-V) conversion amplifier, and then converted to a digital value by an analog-to-digital (A-D) converter.

The above arrangement for the analog operation consumes less power than that for the digital operation because a memory and an operation unit are integrated in the analog arrangement. Nevertheless, when the number of operations repeatedly performed is large as is the case in a neural network performing a convolution operation, there is large and non-negligible power consumption in analog circuits such as the D-A converter, the I-V conversion amplifier, the A-D converter and the like.

It is an object of the present disclosure to provide a neural network circuit that can reduce power consumption.

In an aspect of the present disclosure, a neural network circuit that uses a ramp function as an activation function is provided. The neural network circuit comprises: a memory device including memristors being variable resistance elements connected in a matrix, wherein the memristors serve as memory elements of the memory device and the memory device is driven by a voltage applied thereto; a plurality of current-to-voltage (I-V) conversion amplification circuits that convert currents flowing via the memory elements into voltages and output the voltages; a differential amplifier circuit that performs a differential operation on outputs of two I-V conversion amplification circuits forming a pair included in the plurality of I-V conversion amplification circuits; an analog-to-digital (A-D) converter that performs an A-D conversion on a result of the differential operation of the differential amplifier circuit; and an output determiner that, by referring to input signals of the differential amplifier circuit, performs a first determination of whether a value of an output signal of the differential amplifier circuit belongs to an active region or an inactive region according to the ramp function being a positive polarity or a negative polarity. The output determiner switches over the differential amplifier circuit and the A-D converter between an operating state and a standby state, based on a result of the first determination.

Because the activation function acts on the output signal of the differential amplifier circuit, a range of the output signal where the function value becomes zero is determined according to polarity of the ramp function. Specifically, in the case of the polarity of the ramp function being positive, the function value is zero when the output signal is zero or negative. In the case of the polarity of the ramp function being negative, the function value is zero when the output signal is zero or positive. The above ranges of the output signal which causes the function value to be zero are referred to herein as the inactive region. Ranges of the output signal other than the inactive region are referred to herein as the active region.

When an output signal level of the differential amplifier circuit belongs to the inactive region, the function value automatically becomes zero, and therefore, it is not necessary to perform the A-D conversion in this case. By referring to levels of the differential input signals in advance, it is possible to determine, without performing the differential operation, whether or not the output signal level of the differential amplifier circuit belongs to the inactive region. Therefore, when the output determination unit refers to the input signals of the differential amplifier circuit and determines that the value of the output signal of the circuit belongs to the active region, the output determination unit switches over the differential amplifier circuit and the A-D converter from the operating state to the standby state, whereby the power consumption can be reduced.

First Embodiment

The first embodiment will be described below. In an analog multiply-accumulate operation circuit 1 shown in FIG. 1, a D-A converter 2 converts input data Data_in to a voltage. The voltage obtained by the D-A conversion is applied to a crossbar circuit 4 via a drive amplifier 3. The crossbar circuit 4 uses memristors as memory elements. In the crossbar circuit 4, the memory elements are arranged in a matrix. The crossbar circuit 4 corresponds to a memory device.

A selection circuit 5 selects a voltage applied to the crossbar circuit 4 from among an output voltage of the drive amplifier 3 and a reference voltage Vref. A determination circuit 6 refers to the data Data_in input to the D-A converter 2 and thereby determines whether the value of the data Data_in belongs to an active region or an inactive region. When the value of the data Data_in belongs to the active region, the determination circuit 6 places the D-A converter 2 and the drive amplifier 3 into an operating state. When the value of the data Data_in belongs to the inactive region, the determination circuit 6 switches over the D-A converter 2 and the drive amplifier 3 to a standby state. In accordance with switching over to the standby state, the determination circuit 6 applies the reference voltage Vref to the crossbar circuit 4 via the selection circuit 5. The selection circuit 5 and the determination circuit 6 correspond to an input determiner. Description of the active region and the inactive region will be given later.

Figure 1:
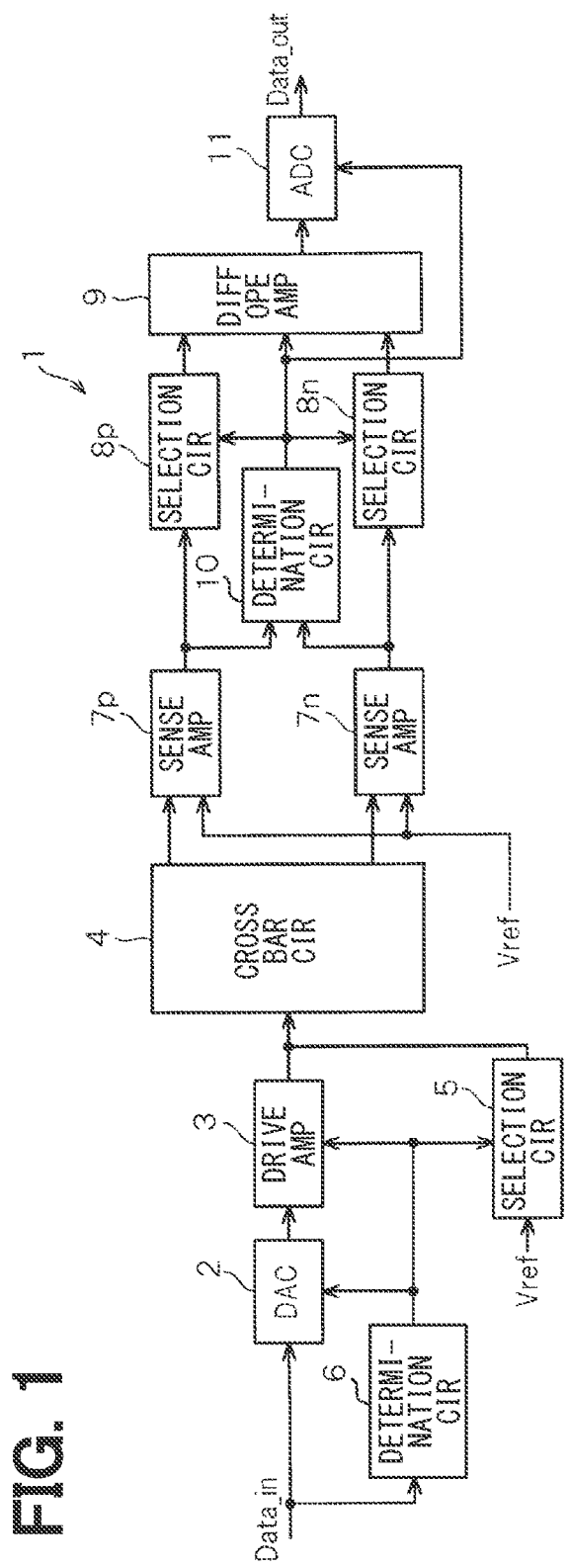
FIG. 1 is a functional block diagram illustrating an analog multiply-accumulate operation circuit constituting a neural network circuit in a first embodiment.

The crossbar circuit 4 outputs currents that depend on the conductance values set to respective memory elements (i.e., memristors). The currents are converted into voltages by sense amplifiers 7p and 7n. Although only two sense amplifiers 7p and 7n forming a pair are shown in FIG. 1 for an illustrative purpose, the neural network circuit may include sense amplifiers more than those illustrated in FIG. 1. The voltages obtained by the sense amplifiers 7p and 7n are input to a differential amplifier 9 via selection circuits 8p and 8n, respectively. The voltages obtained by the sense amplifiers 7p and 7n are also input to a determination circuit 10. A selection circuit 8p includes a switch or the like for opening and closing (connecting and disconnecting) between an output terminal of the sense amplifier 7p and a first input terminal of the differential amplifier 9. A selection circuit 8n includes a switch or the like for opening and closing (connecting and disconnecting) between an output terminal of the sense amplifier 7n and a second input terminal of the differential amplifier 9. The sense amplifiers 7p, 7n correspond to current-to-voltage (I-V) conversion amplifier circuits. The determination circuit 10 corresponds to an output determiner. The selection circuit 8p, 8n correspond to first and second switch circuits.

Figure 2:
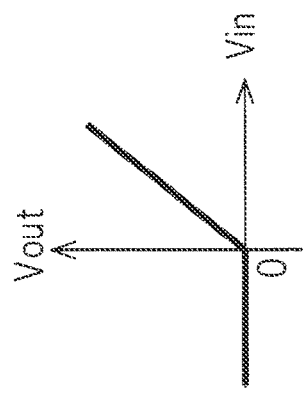
FIG. 2 is a diagram illustrating one example of a ramp function.

An A-D converter 11 performs A-D conversion on an output signal of the differential amplifier 9 and outputs digital data Data_out. An activation function of the neural network is applied to this output data Data_out by an activation function operation circuit. The activation function is, for example, a ramp function f (x) shown in FIG. 2 expressed as f(x)=max(0, x).

This ramp function f (x) has a positive polarity. The output data after the application of the ramp function is input to a next-stage analog multiply-accumulate operation circuit 1.

The determination circuit 10 refers to the output signals of the sense amplifiers 7p and 7n, and determines whether an output signal level of the differential amplifier 9 belongs to the active region or the inactive region, in manners similar to the determination circuit 6. When the output signal level belongs to the active region, the determination circuit 10 closes the selection circuits 8p and 8n to input the signals to the differential amplifier 9 to place the differential amplifier 9 and the A-D converter 11 into the operating state. When the output signal level belongs to the inactive region, the determination circuit 10 opens the selection circuits 8p and 8n to prevent the signals from inputting to the differential amplifier 9 and to place the differential amplifier 9 and the A-D converter 11 into a standby state.

The active region and the inactive region herein are determined according to the activation function. Because the polarity of the ramp function f (x) of the present embodiment is positive, when the output signal of the differential amplifier 9 on the output side of the analog multiply-accumulate operation circuit 1 is zero or shows a negative polarity, the result of the application of the ramp function f (x) is zero. In view of this, the case where the output signal is zero or shows a negative polarity is referred to herein as the cases where the signal belongs to the inactive region. The cases where the output signal shows a positive polarity is referred to herein as the cases where the signal belongs to the active region. When a ramp function with a negative polarity is used, the inactive region and the active region have a reverse relationship with respect to those described above.

When the output signal of the differential amplifier 9 belongs to the inactive region, the output of the ramp function f (x) becomes zero regardless of the differential operation and the A-D conversion. By referring to the differential input signals, it is possible to determine in advance whether or not the output signal belongs to the inactive region. In view of this, the differential amplifier 9 and the A-D converter 11 are put into the standby state to reduce power consumption of the analog multiply-accumulate operation circuit 1. Similarly, when the value of the input data Data_in is zero or has a negative polarity and thus belongs to the inactive region, the output data of the analog multiply-accumulate operation circuit 1 becomes zero. In view of this, the D-A converter 2 and the drive amplifier 3 are put into the standby state to reduce power consumption.

Figure 3:
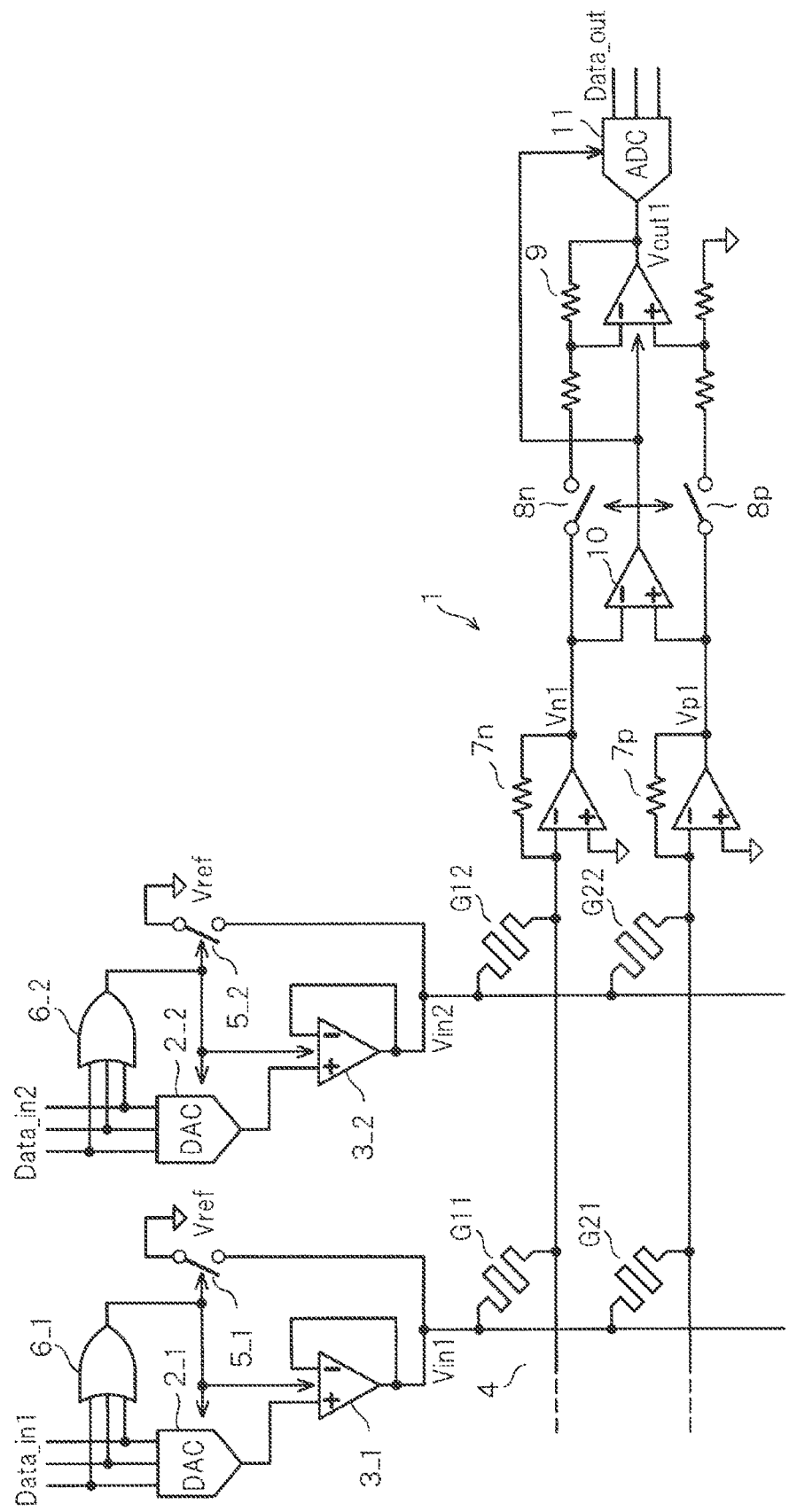
FIG. 3 is a diagram specifically illustrating the analog multiply-accumulate operation circuit of FIG. 1.

As show in FIG. 3, the crossbar circuit 4 includes memory elements G11, G12, G21, and G22 each being a respective memristor. The crossbar circuit 4 may include more memory elements G than that shown in FIG. 3. The present embodiment is based on the premise that the input data Data_in, which is shown as Data_in1 and Data_in2 in FIG. 3, has no polarity bit. The determination circuits 6_1, 6_1 include OR gates that have input terminals connected to respective bits of the input data Data_in1, Data in2. The D-A converters 2_1, 2_2 and the drive amplifiers 3_1, 3_2 are switched over between the operating state and the standby state according to output signals of the OR gates 6_1, 6_2. The selection circuit 5_1, 5_2 include switch circuits each opening and closing between the voltage source of the reference voltage Vref and the output terminal of the corresponding drive amplifiers 3_1, 3_2.

Specifically, when a value of at least one bit of the input data Data_in1 is 1, the output signal of the determination circuit 6_1 becomes a high level. In this case, the D-A converter 2_1 and the drive amplifier 3_1 are maintained at the operating state and the selection circuit 5_1 is off. The voltage Vin1 applied to the crossbar circuit 4 is the output of the drive amplifier 3_1. When values of all of the bits of the input data Data_in1 is zero, the output signal of the determination circuit 6_1 becomes a low level. In this case, the D-A converter 2_1 and the drive amplifier 3_1 are switched over to the standby state and the selection circuit 5 is turned on. The reference voltage Vref is applied to the crossbar circuit, placing the crossbar circuit 4 is in a state where it does not consume power. Depending on the value of the input data Data_in2, substantially the same operations are performed in connection with the D-A converter 2_2, the drive amplifier 3_2, the selection circuit 5_2, and the determination circuit 6_2 to apply the voltage Vin2 to the crossbar circuit 4.

The determination circuit 10 on the output side of the analog multiply-accumulate operation circuit 1 includes a comparator which compares the output signals Vp1 and Vn1 of the sense amplifiers 7p and 7n. When the Vp1 is larger than Vn1, the polarity of the output signal Vout1 of the differential amplifier 9 is positive and belongs to the active region. The determination circuit 10 therefore maintains the differential amplifier 9 and the A-D converter 11 at the operating state and turns on the selection circuits 8p, 8n. When the Vp1 is less than or equal to Vn1, the output signal Vout1 of the differential amplifier 9 becomes zero or negative and belongs to the inactive region. The determination circuit 10 therefore switches over the differential amplifier 9 and the A-D converter 11 to the standby state and turns off the selection circuit 8p, 8n.

In the present embodiment, the analog multiply-accumulate operation circuit 1 constituting the neural network circuit includes the crossbar circuit 4 serving as a memory device. In the crossbar circuit 4, the memristors G11 to G22 are memory elements. The neural network circuit uses the ramp function f(x) with a positive polarity as the activation function. The differential amplifier 9 performs a differential operation on the outputs of the two sense amplifiers 7p and 7n forming a pair. The A-D converter 11 performs A-D conversion on the result of the differential operation.

The determination circuit 10 refers to the input signals of the differential amplifier 9 and thereby makes a determination of whether the value of the output signal of the differential amplifier 9 belongs to the active region or the inactive region according to the polarity of the ramp function f (x). Based on a result of this determination, the determination circuit 10 switches over the differential amplifier 9 and the A-D converter between the operating state and the standby state. That is, in the case where the output signal level of the differential amplifier 9 belongs to the inactive region, the differential amplifier 9 and the A-D converter 10 which do not need to operate in this case are switched over from the operating state to the standby state. Accordingly, it is possible to reduce the power consumption in the analog multiply-accumulate operation circuit 1 of the neural network circuit which typically has a high probability of being in an inactive state.

The selection circuit 8p includes a switch circuit arranged between the output terminal of the sense amplifiers 7p and a first input terminal of the differential amplifier 9. The selection circuit 8n includes a switch circuit arranged between the output terminal of the sense amplifiers 7p and a second input terminal of the differential amplifier 9. When the determination circuit 10 switches over the differential amplifier 9 to the standby state, the determination circuit 10 switches over the selection circuits 8p, 8n from the on state to the off state. As a result, the currents flowing from the sense amplifiers 7p toward the differential amplifier 9 are cut off. It is possible to further reduce the power consumption.

Furthermore, in the case where the input data Data_in belongs to the inactive region, the D-A converter 2 and the drive amplifier 3 which do not need to operate in this case are switched over from the operating state to the standby state by the determination circuit 6. It is therefore possible to further reduce the power consumption. In addition, when switching to the standby state, the determination circuit 6 applies the reference voltage Vref to the crossbar circuit 4 so as not to consume power. It is therefore possible to further reduce the power consumption.

Second Embodiment

Figure 4:
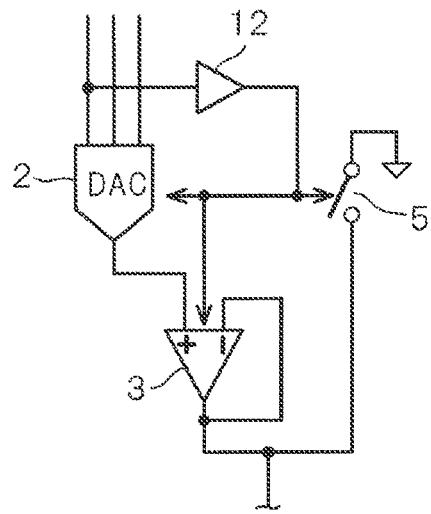
FIG. 4 is a diagram illustrating an input determiner in a second embodiment.

The second embodiment will be described. Between the first and second embodiments, like references are used to refer to like parts to avoid redundant description. The second embodiment is based on the premise that the input data Data_in has a polarity bit. It is assumed that the polarity bit is placed at most significant bit (MSB). It is further assumed that the polarity bit is 1 when a data value is positive and the polarity bit is 0 when the data value is zero or negative. In this case, as shown in FIG. 4, in place of the OR gate of the determination circuit 6, a non-inverting voltage buffer 12 is used to switch over the D-A converter 2 and the drive amplifier 3 between the operating state and the standby state according to the value of the bit polarity. When the two's complement representation is used for the polarity bit, an inverting voltage buffer may be used. The non-inverting voltage buffer 12 and the inverting voltage buffer correspond to an input determiner.

In the second embodiment assuming that the input data Data_in has a polarity bit, the voltage buffer 12 is used as the input determiner to refer to the value of the polarity bit and switch over the D-A converter 2 and the drive amplifier 3 between operating state and the standby state. Therefore, with a smaller size circuit, it is possible to perform the determination on the input side (the determination by the input determiner).

Other Embodiments

The selection circuit 8p, 8n may be provided as necessary.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A neural network circuit that uses a ramp function as an activation function, the neural network circuit comprising:
    a memory device including memristors being variable resistance elements connected in a matrix, wherein the memristors serve as memory elements of the memory device and the memory device is driven by a voltage applied thereto;
    a plurality of current-to-voltage (I-V) conversion amplification circuits that convert currents flowing via the memory elements into voltages and output the voltages;
    a differential amplifier circuit that performs a differential operation on outputs of two I-V conversion amplification circuits forming a pair included in the plurality of I-V conversion amplification circuits;
    an analog-to-digital (A-D) converter that performs an A-D conversion on a result of the differential operation of the differential amplifier circuit; and
    an output determiner that:
        by referring to input signals of the differential amplifier circuit, performs a first determination of whether a value of an output signal of the differential amplifier circuit belongs to an active region or an inactive region according to the ramp function being a positive polarity or a negative polarity; and
        based on a result of the first determination, switches over the differential amplifier circuit and the A-D converter between an operating state and a standby state.

2. The neural network circuit according to claim 1, further comprising:
    a first switch circuit that is arranged between an output terminal of one of the two I-V conversion amplifier circuits and a first input terminal of the differential amplifier circuit; and
    a second switch circuit that is arranged between an output terminal of the other of the two I-V conversion amplifier circuits and a second input terminal of the differential amplifier circuit,
    wherein the output determiner turns off the first switch circuit and the second switch circuit when switching over the differential amplifier circuit to the standby state.

3. The neural network circuit according to claim 1, further comprising:
    a digital-to-analog (D-A) converter that coverts input data into a voltage;
    a drive amplifier that applies the voltage to the memory device; and
    an input determiner that:
        by referring to the input data, perform a second determination of whether a value of the input data belongs to the active region or the inactive region according to the ramp function being the positive polarity or the negative polarity; and
        based on a result of the second determination, switches over the D-A converter and the drive amplifier between an operating state and a standby state.

4. The neural network circuit according to claim 3, wherein
    when the input determiner switches over the D-A converter and the drive amplifier to the standby state, the input determiner applies a reference voltage to the memory device so as not to cause power consumption in the memory device.

5. The neural network circuit according to claim 3, wherein
    in cases where the input data has a polarity bit, the input determiner refers to the polarity bit to perform the second determination.

* * * * *